(12) United States Patent
Kim

(10) Patent No.: US 6,255,224 B1
(45) Date of Patent: Jul. 3, 2001

(54) METHOD OF FORMING CONTACT FOR SEMICONDUCTOR DEVICE

(75) Inventor: Yun-Gi Kim, Kangwon-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/374,055

(22) Filed: Aug. 16, 1999

(30) Foreign Application Priority Data

Aug. 26, 1998 (KR) ................................. 98-34716

(51) Int. Cl.[7] ............................................. H01L 21/3065
(52) U.S. Cl. ........................... 438/723; 438/724; 438/743
(58) Field of Search .................................... 438/723, 700, 438/702, 725, 721, 743, 398, 719, 724

(56) References Cited

U.S. PATENT DOCUMENTS

| 5,597,756 | * | 1/1997 | Fazan et al. | 438/398 |
| 5,717,250 | * | 2/1998 | Schuele et al. | 257/754 |
| 6,008,084 | * | 12/1999 | Sung | 438/241 |

* cited by examiner

*Primary Examiner*—Benjamin L. Utech
*Assistant Examiner*—Binh X Tran
(74) *Attorney, Agent, or Firm*—Jones Volentine, P.L.L.C.

(57) ABSTRACT

A method of forming a contact for a dynamic random access memory device is disclosed. In this method, a first insulating layer is formed on a semiconductor substrate. First and second contact pads are formed in the first insulating layer and on a semiconductor substrate in such a manner that a top surface of the first insulating layer is higher than top surfaces of the contact pads. Then a second insulating layer is formed over the substrate, which layer shows a bad step coverage. The second insulating layer is etched until the surfaces of the first and second contact pads are exposed. Then a first conductive layer is formed over the entire surface of the semiconductor substrate, and the first conductive layer is flattened, leaving some thickness of the second insulating layer. Then a second conductive layer is formed over the first conductive layer, and the second and first conductive layers are sequentially etched using a bit line forming mask, to form a bit line. Under this condition, the first conductive layer on the first contact pad is over-etched to form an electrical insulation from the bit line. When forming the direct contacts of a cell region and a core region, the photo process for forming the DC of the cell region or the BC and DC of the cell region, and the photo process for forming the DC of the core region can be skipped to simplify the formation process, thereby saving manufacturing costs.

16 Claims, 9 Drawing Sheets

METHOD OF FORMING CONTACT FOR SEMICONDUCTOR DEVICE

This application relies for priority upon Korean Patent Application No.98-34716, filed on Aug. 26, 1998, the content of which are herein incorporated by reference in their entirety.

FIELD OF THE INVENTION

The present invention relates to a semiconductor device, and more particularly to a method of forming a contact for a dynamic random access memory (DRAM) device.

BACKGROUND OF THE INVENTION

As DRAM devices are designed with greater densities, the photo process used to make them becomes increasingly difficult, since the design rule must be continually reduced. For example, in a 256 Mbit DRAM, the design rule has been reduced to less than 0.2 micrometers. In order to solve this problem, a photoresist (PR) flow process has been adopted. In the PR flow process, however, the PR flow amounts vary depending upon the design sizes. As a result, there are difficulties in applying this process.

FIGS. 1A to 1D illustrate the conventional method for forming contacts in a semiconductor device.

Referring to FIG. 1A, a device isolating region 12 is initially formed to define an active region in a semiconductor substrate 10. A cell transistor is then formed over the semiconductor substrate 10. As is generally well known, in forming the cell transistor, a gate electrode is formed by sequentially stacking a gate oxide layer (not shown), a polysilicon layer 14a, and a silicide layer 14b. Furthermore, a source/drain region (not shown) is formed in the semiconductor substrate 10 along both sides of the gate electrode layers 14a and 14b. Then, in order to insulate the gate electrode layers 14a and 14b, a gate mask 14c is formed over the silicide layer 14b to complete the gate electrode stack 14, and a nitride spacer 15 is formed on side walls of the polysilicon layer 14a and the silicide layer 14b.

A first inter-layer insulating layer 16 is then formed over the semiconductor substrate 10, covering the gate electrode stack 14. The first inter-layer insulating layer 16 may be, for example, a BPSG layer. Then, the first inter-layer insulating layer 16 is flattened using a BPSG flow process and a chemical mechanical polishing (CMP) process. The first inter-layer insulating layer 16 is then etched using a contact hole forming mask 18 until the semiconductor substrate 10 of the cell region is exposed, thereby forming a self-aligned contact pad forming contact holes 20.

Referring to FIG. 1B, a polysilicon layer (not shown) is formed over the first inter-layer insulating layer 16, filling the contact holes 20. Then the polysilicon layer is etched using an etch-back process or a CMP process, and thus self-aligned contact pads 22a and 22b, i.e., a DC pad 22a and a BC pad 22b, are formed. The DC pad 22a and the BC pad 22b are each electrically connected to the semiconductor substrate 10.

Then, a second inter-layer insulating layer 24 is formed over the first inter-layer insulating layer 16, covering the self-aligned pads 22a and 22b. The second inter-layer insulating layer may be, for example, a PE-TEOS layer. The second inter-layer insulating layer 24 is then etched, using a first contact hole forming mask 26, until the surfaces of the cell region and the DC pad 22a are exposed. In this manner, a bit line DC contact hole 27 is formed.

As shown in FIG. 1C, the first contact hole forming mask 26 is then removed. After that, the second and first inter-layer insulating layers 24 and 16 are sequentially etched by using a second contact hole forming mask 28, until the surface of the semiconductor substrate 10 in the core region is exposed, thereby forming a core DC contact hole 29.

As described above, as DRAM devices achieve higher densities, it becomes very difficult to simultaneously form DCs both at the cell array region and in the core/peripheral region since two different fine patterns are required for the cell array region and core/peripheral region. Therefore, the photo process for DC formation cannot be applied simultaneously to both the cell array region and the core/peripheral region.

Referring to FIG. 1D, the second contact hole forming mask 28 is removed. Then, a polysilicon layer 30 is formed over the second inter-layer insulating layer 24, filling both the bit line DC contact hole 27 and the core DC contact hole 29. The polysilicon layer 30 is then flattened in such a manner that some thickness of the second inter-layer insulating layer 24 remains. Then, a bit line forming tungsten silicide layer 32 is formed over the polysilicon layer 30.

Finally, the silicide layer 32 and the polysilicon layer 30 are sequentially etched using a bit line forming mask (not shown). As a result, bit lines are formed that are electrically connected through the direct contacts of the cell region and the core region to the DC pad 22a and to the semiconductor substrate 10.

The above-mentioned method uses two photolithography processes for the formation of DCs both at the cell array region and in the core/peripheral region, resulting in process complexity and high manufacturing cost. Accordingly, there is a need of a method that can form a direct contact at the cell array region and at the peripheral region using a simple process having a low cost.

SUMMARY OF THE INVENTION

The present invention is intended to overcome the above described disadvantages of the conventional technique.

Therefore it is an object of the present invention to provide a method of forming a contact for a semiconductor memory device, in which when forming the direct contacts in the cell and core regions, the process can be simplified sufficiently to save on manufacturing costs.

The present invention provides a method for forming contacts in a semiconductor substrate. In this method, first and second contact pads are formed over a semiconductor substrate in such a manner that top surfaces of the contact pads are lower in level as compared to a top surface of the first insulating layer formed over them. Then a second insulating layer that exhibits a poor step coverage is formed over the first insulating layer. The second insulating layer is then etched until the surfaces of the first and second contact pads are exposed. Then, a first conductive layer is formed over the semiconductor substrate, and the first conductive layer is flattened such that it leaves a partial thickness of the second insulating layer. A second conductive layer is then formed over the first conductive layer, and the second and first conductive layers are sequentially etched, using a bit line forming mask, to form a bit line. Under this condition, the first conductive layer, over the first self-aligned contact pad, is over-etched to form an electrical insulation from the bit line. In this method, when forming the direct contacts (DCs) of a cell region and a core region, the photo process for forming the direct contact of the cell region or forming the buried contact and direct contact of the cell region, and the photo process for forming the direct contact of the core region can be skipped to simplify the formation process, thereby saving the manufacturing cost.

In achieving the above object, the method for forming a contact in a semiconductor memory device according to the present invention includes forming a transistor over a semiconductor substrate, forming a first insulating layer over the semiconductor substrate and the transistor, forming first and second contact pads in the insulating layer, top surfaces of the contact pads being lower in level as compared to a top surface of the first insulating layer, forming a second insulating layer over the first insulating layer, the second insulating layer exhibiting a poor step coverage, etching the second insulating layer until surfaces of the first and second contact pads are exposed, forming a first conductive layer over the semiconductor substrate, and the first and second insulating layers, and forming a second conductive layer over the flattened first conductive layer.

The method may further comprise flattening the first conductive layer to leave a partial thickness of the second insulating layer over the first insulating layer.

The flattening of the first conductive layer may be performed by an etching process. The semiconductor substrate preferably has a cell region and a core region. In this case, the method further includes etching the first and second insulating layers in the core region, using a contact hole forming mask, to form a direct contact hole.

The method may further comprise etching the second and first conductive layers to form a bit line, wherein the first conductive layer over the first contact pad is over-etched to electrically insulate the contact pad from the bit line.

Alternatively, the method may also include removing a partial thickness of the second and first insulating layers along both sides of the bit line through an etch-back process using the bit line as a mask.

The first insulating layer preferably comprises an oxide, and the second insulating layer preferably comprises a material selected from the group consisting of SiON, PE-SiN, PE-SiH$_4$, and plasma enhanced-tetraethylorthosilicate (PE-TEOS). The first conductive layer preferably comprises polysilicon, and the second conductive layer preferably comprises tungsten silicide.

The first contact pad is preferably a storage node contact pad, and the second contact pad is preferably a bit line contact pad. The partial thickness of the first conductive layer is preferably about 500 Å.

In another aspect of the present invention, the method for forming a contact in a semiconductor memory device according to the present invention includes forming a transistor over a semiconductor substrate having a cell array region and a core region, forming a first insulating layer over the semiconductor substrate, etching the first insulating layer until a surface of the semiconductor substrate is exposed, to form first and second contact holes in the cell array region and a third contact hole in the core region, filling the contact holes with a first conductive layer, etching the first conductive layer to form first and second contact pads in the cell array region and a third contact pad in the core region, the first, second, and third contact pads being recessed in the contact holes a predetermined depth from a top surface of the first insulating layer, and forming a second insulating layer over the first insulating layer, the second insulating layer exhibiting a poor step coverage, and exposing upper surfaces of the first, second, and third contact pads.

The method may further comprise forming second and third conductive layers over the semiconductor substrate and the first, second, and third contact pads, and etching the third and second conductive layers using a bit line forming mask so as to form a bit line, wherein the second conductive layer over the first contact pad is over-etched to electrically insulate the first contact pad from the bit line.

The semiconductor substrate has a cell region and a core region. In this case, the first self-aligned contact pad is preferably formed in the cell region and the second self-aligned contact pad is preferably formed in the core region.

In another example of the present invention, the method may further comprise removing a partial thickness of the insulating material and the inter-layer insulating layer at both sides of the bit line, using the bit line as a mask, after forming the bit line. This is preferably carried out through the use of an etch-back process.

BRIEF DESCRIPTION OF THE DRAWINGS

The above objects and other advantages of the present invention will become more apparent by describing in detail preferred embodiments of the present invention, with reference to the attached drawings in which.

DETAILED DESCRIPTION OF THE PREFERRED EMBODIMENTS

Figure 1A:
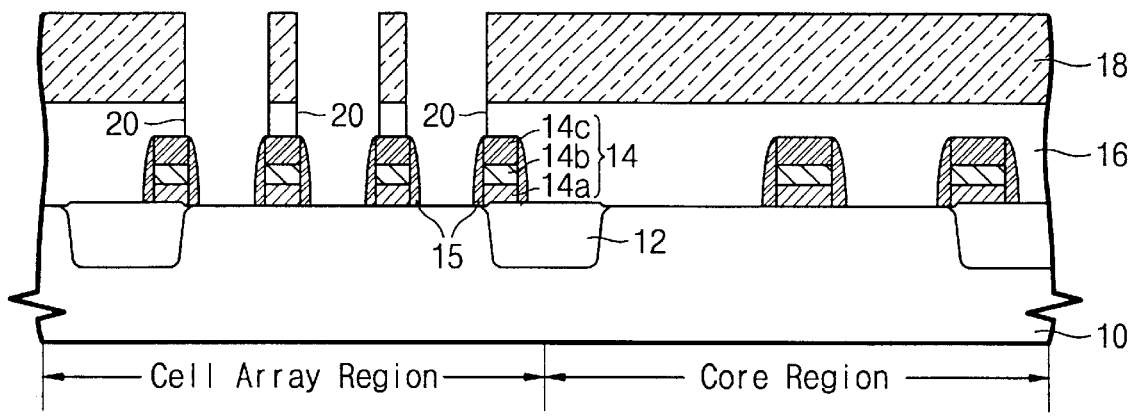
FIGS. 1A to 1D illustrate a conventional contact formation process for a semiconductor memory device.
Figure 1B:
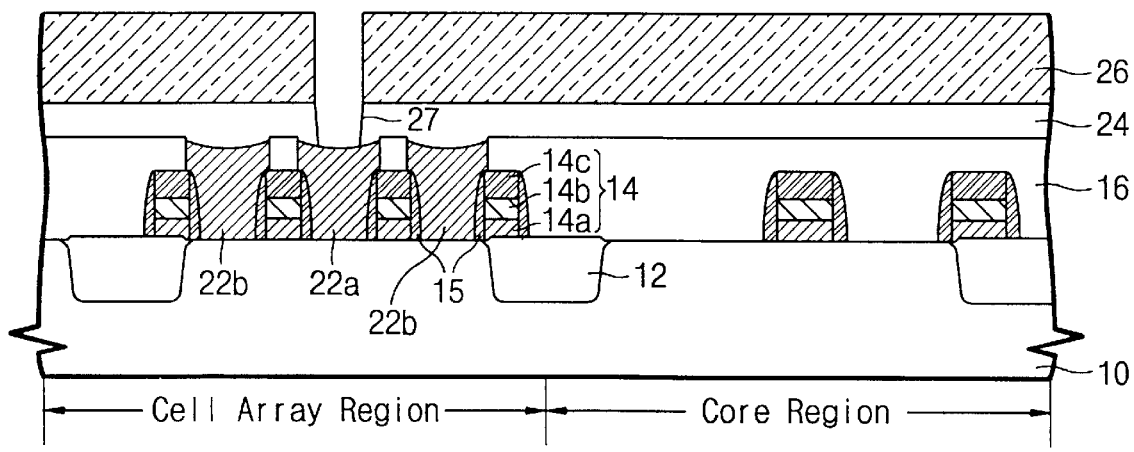
Figure 1C:
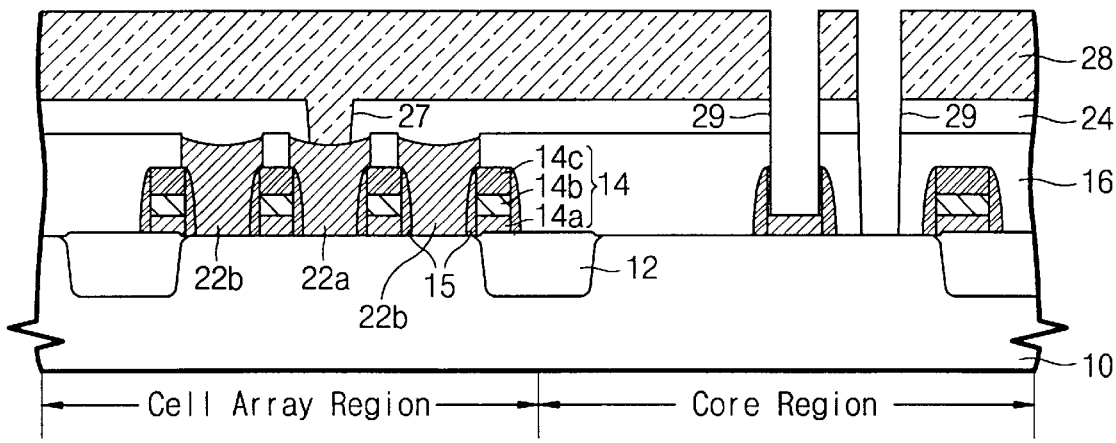
Figure 1D:
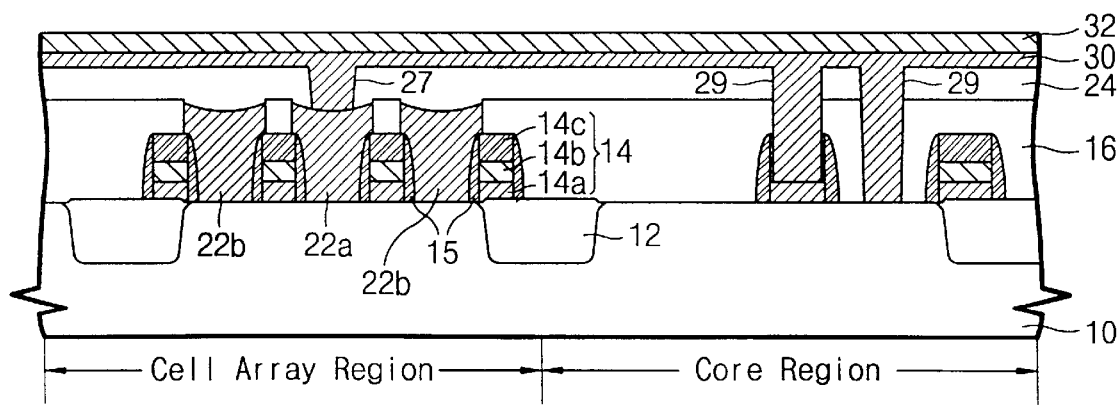

The present invention will now be described more fully below with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. Moreover, each embodiment described and illustrated herein includes its complementary conductivity type embodiment as well as the disclosed conductivity type embodiment.

First Preferred Embodiment

A first preferred embodiment of the present invention will be described referring to FIGS. 2 and 3A to 3G.

Figure 2:
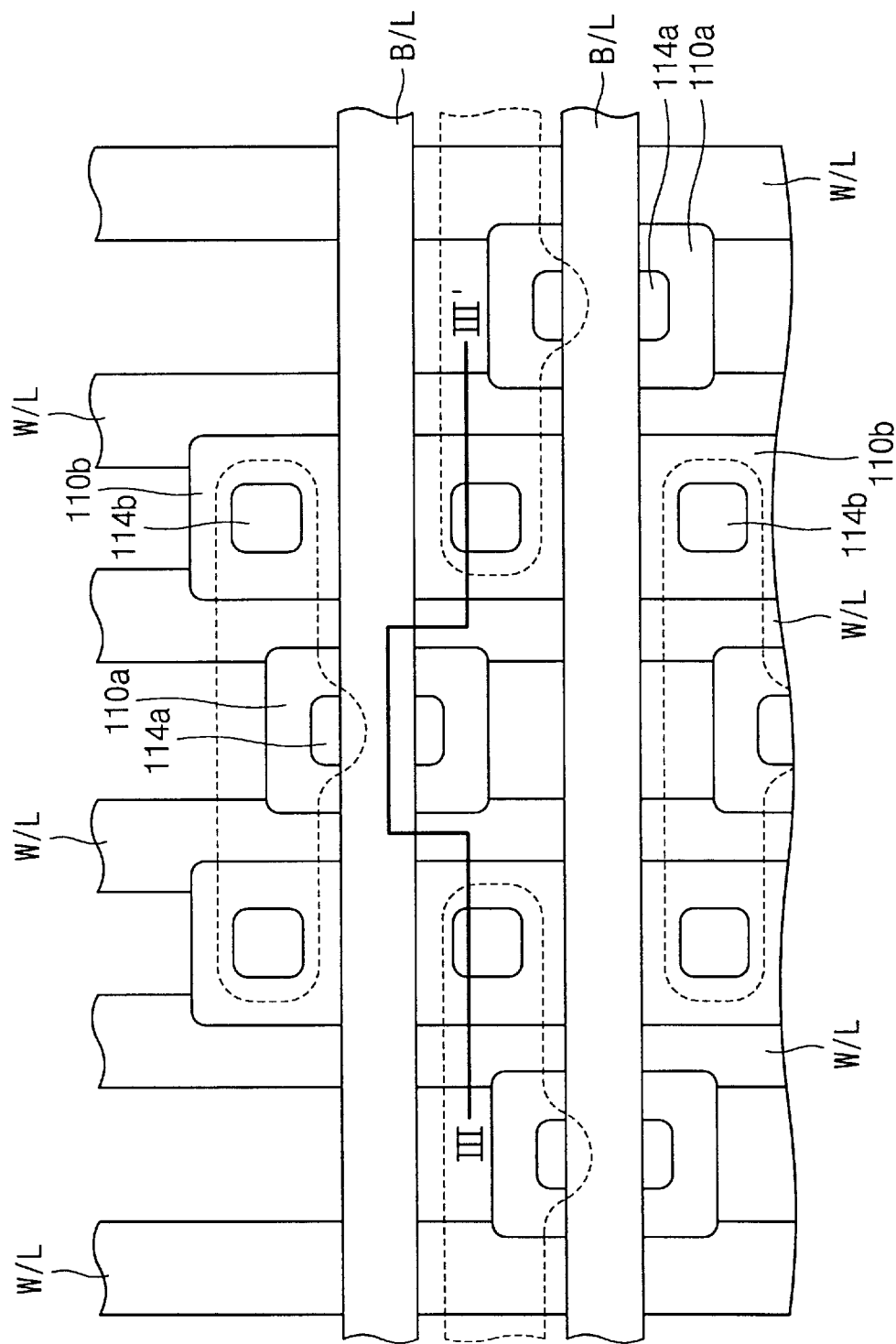
FIG. 2 illustrates the layout of the semiconductor memory device according to preferred embodiments of the present invention.

FIG. 2 illustrates the layout of a semiconductor memory device according to the preferred embodiments of the present invention. FIGS. 3A to 3G are sectional views taken along the line III–III' of FIG. 2, to show a contact formation process for a semiconductor memory device according to the first preferred embodiment of the present invention.

Referring now to FIG. 2, a plurality of word lines W/L are arranged in parallel. A plurality of bit lines B/L are also arranged in parallel, but crossing the word lines. Between the respective word lines, storage node forming contact pads 110b and bit line forming contact pads 110a are alternately arranged. The pads 110b and 110a are electrically connected through corresponding buried contacts (BCs) 114b and direct contact (DCs) 114a. By referring to FIG. 2, the process margin between the self-aligned contact, that is, the direct contact and the buried contact, and the bit lines can be observed, and the connection direction of the bit lines and the direct contacts can be seen.

Figure 3A:
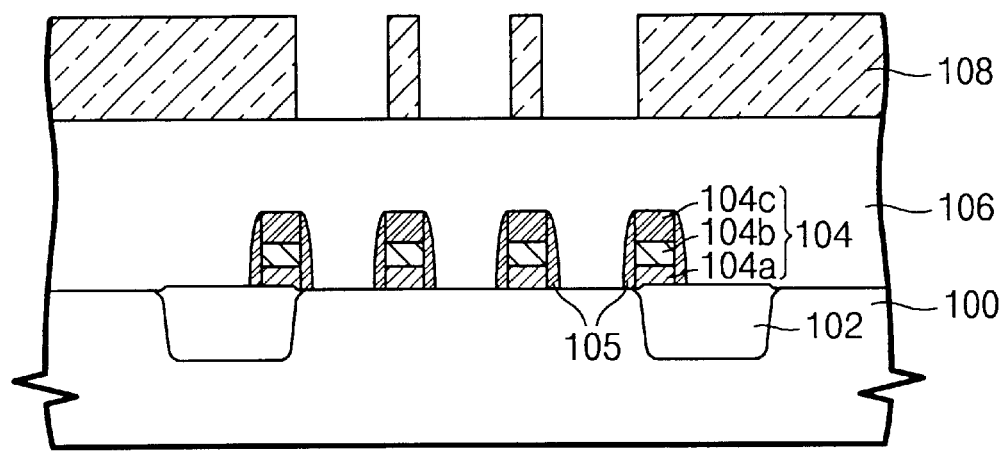
FIGS. 3A to 3G are sectional views taken along the line III–III' of FIG. 2, that show a contact formation process for a semiconductor memory device according to a first preferred embodiment of the present invention.

Referring to FIG. 3A, the method of forming the contacts is preferably carried out in the following manner. First, a device isolating region 102 is formed in the semiconductor substrate 100, to define an active region and an inactive region. As is well known in the art, the substrate includes a cell array region and a core region. The cell array region is where a plurality of memory cell arrays are to be formed and the core region is where circuits are to be formed in order to operate the memory cell. The device isolating region 102 is preferably formed by applying a generally known trench isolation process. A polysilicon layer 104a, a silicide layer 104b, and a gate mask 104c are then sequentially formed over a gate oxide layer (not shown) formed over the semiconductor substrate 100. Then, the gate mask 104c, the silicide layer 104b, and the polysilicon layer 104a are sequentially etched, using a gate forming mask, to form gate electrode 104.

A nitride layer is then formed over the semiconductor substrate 100, covering the gate electrode 104. The nitride layer is etched by applying an etch-back process, to form nitride spacers 105 on the side walls of the gate electrode 104. Impurity ions are then implanted into the semiconductor substrate 100 along both sides of the nitride spacers 105, thereby forming a source/drain region (not shown). Under this condition, the gate electrode forming conductive layers 104a and 104b are electrically insulated by the gate mask 104c and the nitride spacers 105 from self-aligned contact pads which will be formed later.

An inter-layer insulating layer 106 is then formed over the entire surface of the semiconductor substrate 100. Then, a photoresist layer pattern 108 for forming a self-aligned contact pad is formed over the inter-layer insulating layer 106.

Figure 3B:
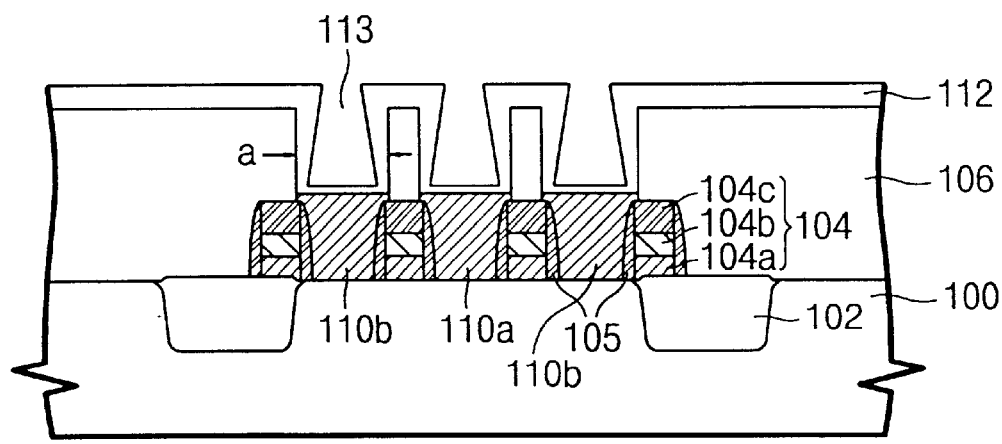

Referring to FIG. 3B, the inter-layer insulating layer 106 is etched at the both sides of the gate electrode 104 using the photoresist layer pattern 108 as a mask, until the surface of the semiconductor substrate 100 is exposed. Thus a contact hole for the self-aligned contact pad is formed. The photoresist layer pattern 108 is then removed, and a polysilicon layer (not shown) is formed over the inter-layer insulating layer 106 to fill the contact hole. The polysilicon layer is then etched back to form a recess 113a predetermined depth from a top surface of the first inter-layer insulating layer 106 in the contact hole. Thus self-aligned contact pads 110a and 110b, i.e., a DC pad 110a and a BC pad 110b, are formed, the top of which is lower in level than that of the first insulating layer 106.

An insulating material layer 112 is then formed over the resulting structure. The insulating material layer 112 is preferably selected such that it exhibits a poor step coverage. For example, the insulating material layer 112 may be a material selected from the group consisting of SiON, plasma enhanced SiN (PE-SiN), and plasma enhanced-tetraethylortho-silicate (PE-TEOS) layers. The thickness of the insulating material layer 112 may vary depending on the diameter of the recessed region 113 formed in the inter-layer insulating layer 106. For example, if the diameter of the recessed region is 260 nm, then the thickness is preferably about 70 nm.

Under this condition, because of the poor step coverage, the layer 112 has a profile such that the top parts of the recessed portion 113 are thick, thus making the opening size of the recessed region 113 narrow. In contrast, the bottom parts of the recessed portion, i.e, the parts on the contact pads 110a and 110b is thin. For example, in this preferred embodiment, the upper part of the insulating material layer 112 has a thickness ten times that of the lower part of the insulating material layer 112 on the contact pads 110a and 110b. The reason why a layer having a poor step coverage is formed is to secure a process margin for a short circuit between the buried contact and the bit line, which are formed in a later step.

Figure 3C:
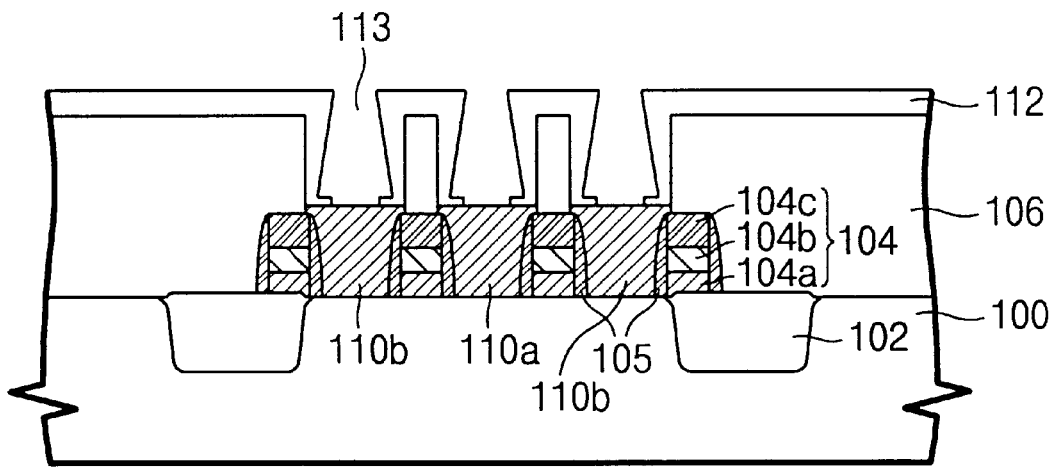

Referring to FIG. 3C, in order to electrically connect the direct contact and the buried contact (which are formed later) to the contact pads 110a and 110b, respectively, some portion of the lower part of the insulating material layer 112 (as much as the upper width of the upper part) are etched using a wet or dry etching process.

Figure 3D:
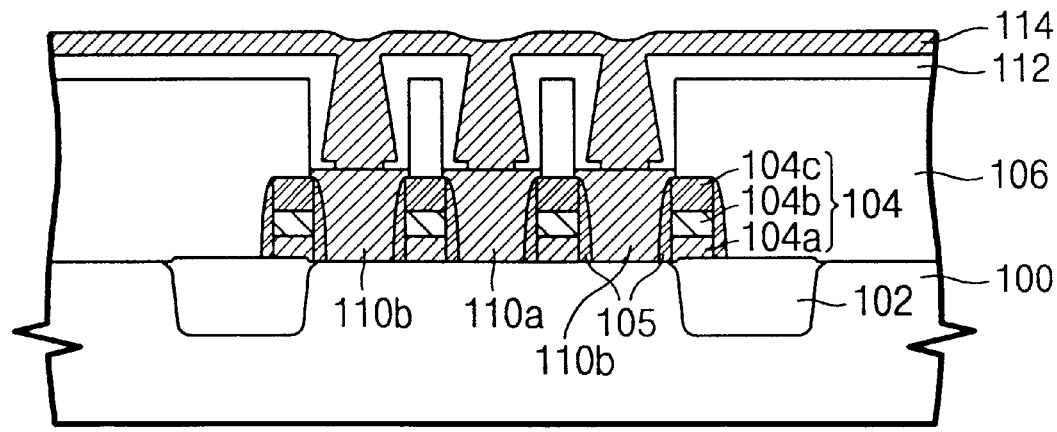

Then, a DC contact hole (not shown) is formed using a photo process and a dry etching process only on the core region. Under this condition, the cell region is left intact. Then a polysilicon layer 114 is deposited over the entire surface of the semiconductor substrate 100, thereby filling the DC contact holes in the core region and the recessed portions 113, as shown in FIG. 3D. As is apparent from this explanation, there is no need to perform a photolithography process for DC contact holes in the cell array region since the recessed portion 113 serves as a DC contact hole.

Figure 3E:
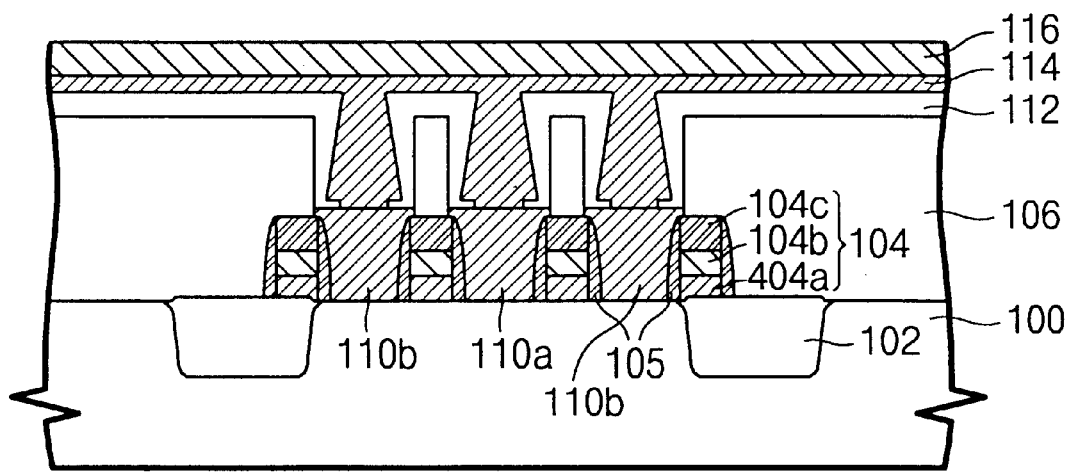

Referring to FIG. 3E, a partial thickness of the polysilicon layer 114 is etched back to leave behind a predetermined thickness of the polysilicon layer 114 over the insulating material layer 112. For example, about 500 Å of the polysilicon layer 114 may be left after the etch back. This portion of the polysilicon layer 114 acts to improve the adhesion between the insulating material layer 112 and a tungsten silicide layer 116 (to be formed over the polysilicon layer 114). If the tungsten silicide layer 116 is formed directly on the insulating material layer 112, a lifting phenomenon can happen such that the insulating material layer 112 and the silicide layer 116 can become spaced apart.

Figure 3F:
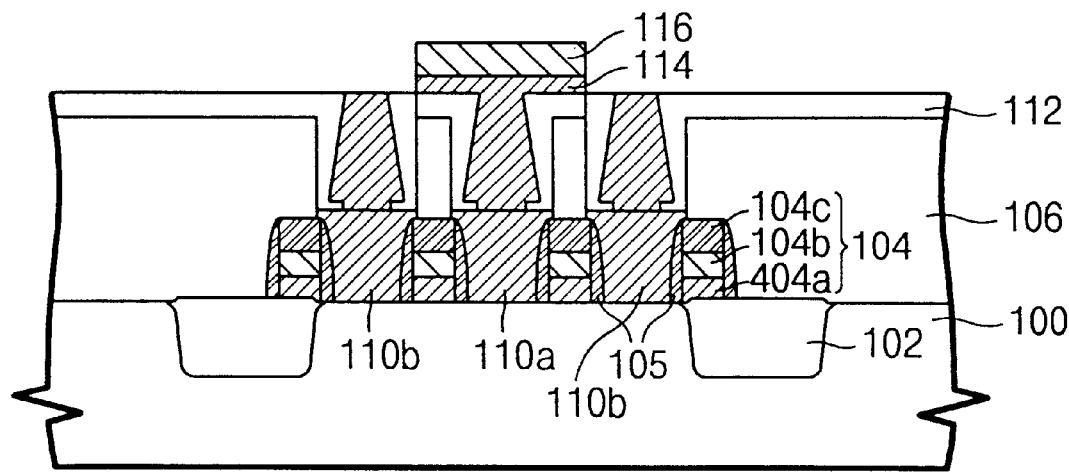

The tungsten silicide layer 116 is then formed over the polysilicon layer 114. Finally, by using a bit line forming mask, the silicide layer 116 and the polysilicon layer 114 are sequentially etched. Thus as shown in FIG. 3F, the bit line (not shown) is formed. The bit line is electrically connected to the DC pad 110a through the lower direct contact. Under this condition, the portion of the polysilicon layer 114 formed over the BC pad 110b is over-etched so as to be insulated from the bit line.

Figure 3G:
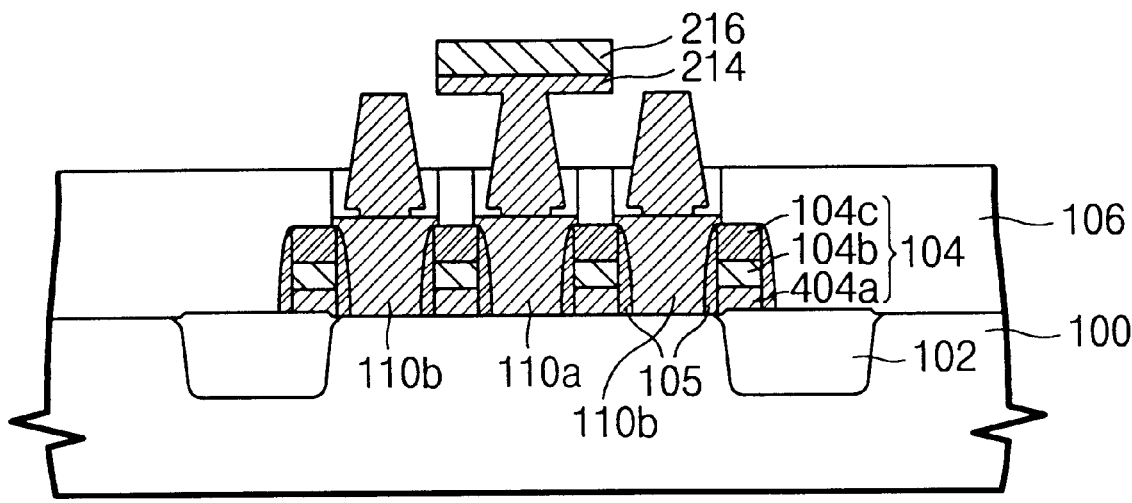

Referring to FIG. 3G, the insulating material layer 112 and the inter-layer insulating layer 106 may be partially removed using the bit line of FIG. 3E as a mask. This process is used to remove a void that is generated due to the inverse step during the deposition of an inter-layer insulating layer to be formed later, thereby upgrading the profile. This final process may or may not be carried out depending on the required conditions of the device.

Second Preferred Embodiment

A second preferred embodiment of the present invention will now be described referring to FIGS. 4A to 4D.

FIGS. 4A to 4D illustrate a contact formation process for a semiconductor memory device according to a second preferred embodiment of the present invention. The significant difference from the first preferred embodiment is that the self-aligned contact forming mask is formed in both the cell array region and the core region. Accordingly, a photolithography process for DC contact hole formation in the core region can be omitted.

Figure 4A:
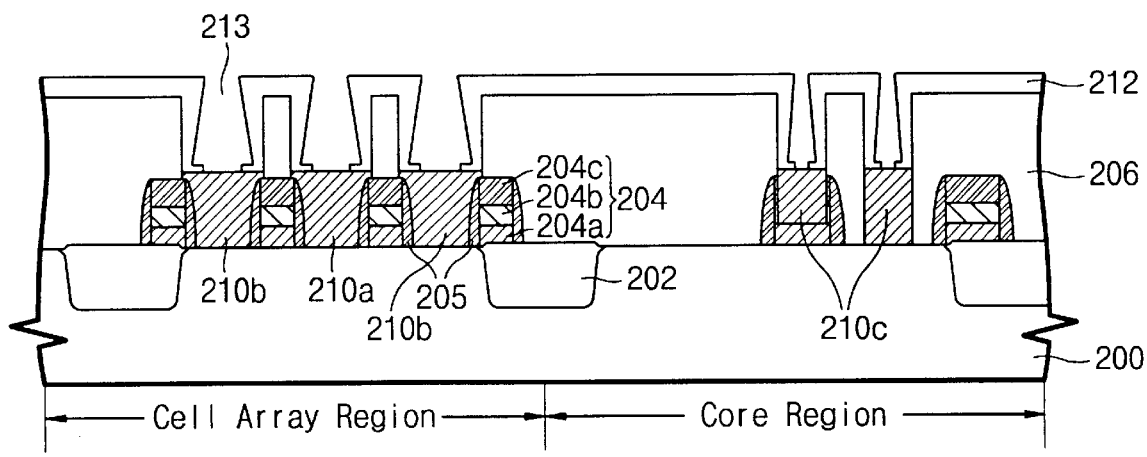
FIGS. 4A to 4D are sectional views that illustrate a contact formation process for a semiconductor memory device according to a second preferred embodiment of the present invention.

A description of all steps prior to the process steps of forming a source/drain region and a gate electrode 204 will be omitted since they are substantially identical to those in the first preferred embodiment. Referring now to FIG. 4A, an inter-layer insulating layer 206 is formed over a semiconductor substrate 200, covering the gate electrode 204. The inter-layer insulating layer 206 is then etched until the surfaces of the semiconductor substrate 200 in the cell region and the core regions are exposed, using a contact forming mask that extends down to the direct contact forming region of the core region. In this manner, contact holes are created as for both self-aligned pads and a direct contact.

A first polysilicon layer (not shown) is then formed over the inter-layer insulating layer 206 to fill the contact holes. Then the first polysilicon layer is etched back to recess 213 at a predetermined depth from a top surface of the inter-layer insulating layer 206. Thus self-aligned contact pads 210a and 210b, i.e., a DC pad 210a and a BC pad 210b, and a part of a direct contact 210c, are formed, in such a manner that they are electrically connected to the semiconductor substrate 200 of the cell region and the core region, respectively.

Then, an insulating material layer 212 is formed that exhibits a poor step coverage along the surfaces of the structure formed on the semiconductor substrate 200. For example, the insulating material layer 212 may be any one of a PE-TEOS (plasma enhanced-tetraethyl-ortho-silicate) layer, an SiON layer, a PE-SiN layer and a PER-SiH$_4$ layer. Under this condition, owing to the poor step coverage, the insulating material layer 212 has a deposition profile such that it will be formed thickly at an upper part of the recessed portion 213 and, will be formed thinly at a lower part of the recessed portion 213, i.e., on the contact pads 110a and 110b. The reason why a layer having a poor step coverage is formed is to secure a process margin for a short circuit between the buried contact and the bit line to be formed later.

In order to form an electrical connection between the direct contact and the buried contact (to be formed later), and the contact pads 210a and 210b, respectively, a partial thickness of the lower part of the insulating material layer 212 (as much as the upper width of the upper part) is etched using a wet or dry etching process.

Figure 4B:
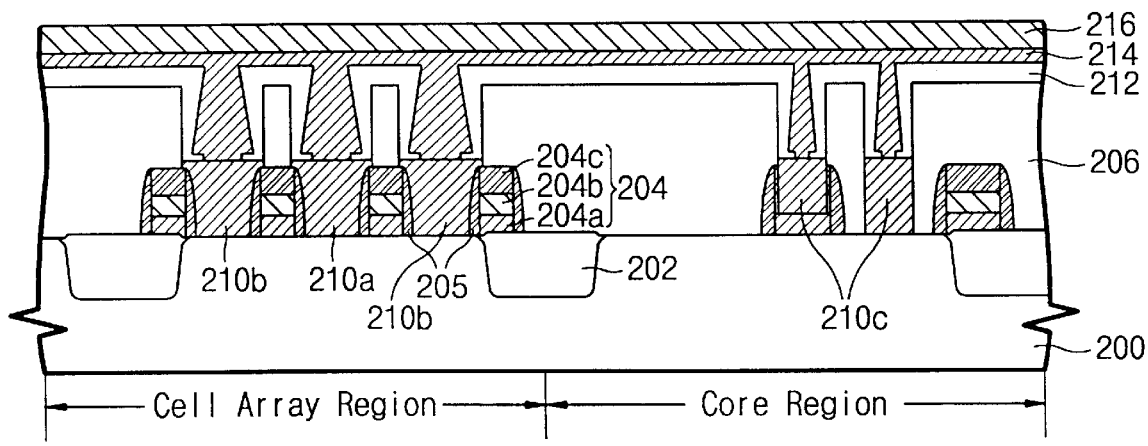

Referring to FIG. 4B, a second polysilicon layer 214 is formed over the insulating material layer 212 to fill the recessed region 213 in the cell region and the core region. Therefore, the photo process for forming the direct contact can be skipped not only at the cell region but also at the core region, unlike in the first embodiment of the present invention.

Figure 4C:
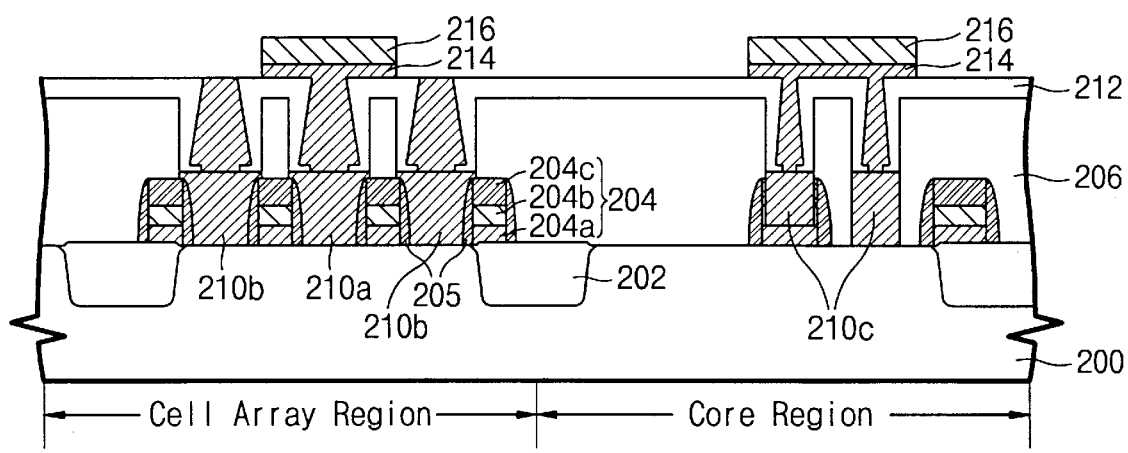

In order to improve the adhesion during the formation of a silicide layer later, the second polysilicon layer 214 is flattened by etching it back in such a nianner that a partial thickness of the insulating material layer 212 remains on the insulating material layer 212. A tungsten silicide layer 216, e.g., tungsten silicide, is then formed over the polysilicon layer 214, for the two to serve as a bit line. Then the silicide layer 216 and the polysilicon layer 214 are sequentially dry-etched using a bit line forming mask, to form the bit line. During the dry-etching, the polysilicon layer 214 on the BC pad 210a is partly over-etched so as for the layer 214 will be insulated from the bit line as shown in FIG. 4C.

Figure 4D:
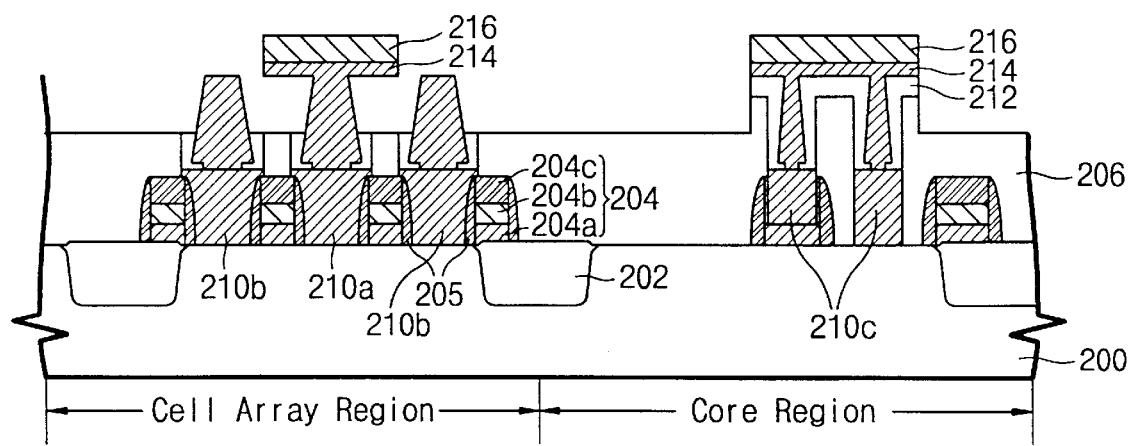

Then in order to eliminate the generation of a void during the deposition of a later inter-layer insulating layer by using a bit line forming mask, certain parts of the insulating material layer 212 and the inter-layer insulating layer 206 is removed, as shown in FIG. 4D. However, this process step may or may not be carried out depending on the required conditions of the device.

According to the present invention as described above, during the formation of the direct contacts (DCs) of the cell region and the core region, the DC photo process for the cell region, or the BC and DC photo processes for the cell region, and the DC photo process for the core region, can be skipped to simplify the process steps so as to save the manufacturing cost.

What is claimed is:

1. A method of forming a contact in a semiconductor memory device, comprising:
    forming a transistor over a semiconductor substrate;
    forming a first insulating layer over the semiconductor substrate;
    forming first and second contact pads in the insulating layer, top surfaces of the contact pads being lower in level as compared to a top surface of the first insulating layer;
    forming a second insulating layer over the first insulating layer, the second insulating layer exhibiting a poor step coverage;
    etching the second insulating layer until surfaces of the first and second contact pads are exposed;
    forming a first conductive layer over the semiconductor substrate and the first and second insulating layers;
    forming a second conductive layer over the first conductive layer.

2. A method of forming a contact in a semiconductor memory device, as recited in claim 1, further comprising flattening the first conductive layer to leave a partial thickness thereof over the second insulating layer.

3. A method of forming a contact in a semiconductor memory device, as recited in claim 1, further comprising removing a partial thickness of the second and first insulating layers along both sides of the bit line through an etch-back process using the bit line as a mask.

4. A method of forming a contact in a semiconductor memory device, as recited in claim 1, wherein the first insulating layer is an oxide layer, and the second insulating layer comprises a material selected from the group consisting of SiON, PE-SiN, PE-SiH$_4$, and plasma enhanced-tetraethylortho-silicate (PE-TEOS).

5. A method of forming a contact in a semiconductor memory device, as recited in claim 1, wherein the first self-aligned contact pad is a storage node contact pad, and the second self-aligned contact pad is a bit line contact pad.

6. A method of forming a contact in a semiconductor memory device, as recited in claim 1, wherein the first conductive layer comprises polysilicon, and the second conductive layer comprises tungsten silicide.

7. A method of forming a contact in a semiconductor memory device, as recited in claim 1, wherein the partial thickness of the second insulating layer is about 70 nm and the diameter of the contact pads is about 260 nm.

8. A method of forming a contact in a semiconductor memory device, comprising:
    forming a transistor over a semiconductor substrate;
    forming a first insulating layer over the semiconductor substrate;
    forming first and second contact pads in the insulating layer, top surfaces of the contact pads being lower in level as compared to a top surface of the first insulating layer;

forming a second insulating layer over the first insulating layer, the second insulating layer exhibiting a poor step coverage;

etching the second insulating layer until surfaces of the first and second contact pads are exposed;

forming a first conductive layer over the semiconductor substrate and the first and second insulating layers;

forming a second conductive layer over the first conductive layer; and sequentially etching the second and first conductive layers by using a bit line forming mask to form a bit line that is electrically connected to the contact pads, wherein the first conductive layer over the first self-aligned contact pad is over-etched to electrically insulate the first contact pad from the bit line.

9. A method of forming a contact in a semiconductor memory device, as recited in claim 8, further comprising etching the first and second insulating layers in the core region, using a contact hole forming mask, to form a direct contact hole.

10. A method for forming a contact in a semiconductor memory device, comprising:

forming a transistor over a semiconductor substrate having a cell array region and a core region;

forming a first insulating layer over the semiconductor substrate;

etching the first insulating layer until a surface of the semiconductor substrate is exposed, to form a first and second contact holes in the cell array region and a third contact hole in the core region;

filling the contact holes with a first conductive layer;

etching the first conductive layer to form first and second self-aligned contact pads in the cell array region and a third self-aligned contact pad in the core region, the first, second, and third contact pads being recessed in the contact holes a depth from a top surface of the first insulating layer; and forming a second insulating layer over the first insulating layer, the second insulating layer exhibiting a poor step coverage, and exposing upper surfaces of the first, second, and third contact pads.

11. A method for forming a contact in a semiconductor memory device, as recited in claim 10, wherein the first self-aligned contact pad is formed in the cell array region and the second self-aligned contact pad is formed in the core region.

12. A method for forming a contact in a semiconductor memory device, as recited in claim 10, further comprising removing a partial thickness of the first and second insulating layers at both sides of the bit line, using the bit line as a mask, after forming the bit line.

13. A method for forming a contact in a semiconductor memory device, as recited in claim 10, wherein the first insulating layer comprises an oxide, and the second insulating layer comprise a material selected from the group consisting of SiON, PE-SiN, PE-SiH$_4$ and PE-TEOS (plasma enhanced-tetraethylortho-silicate).

14. A method for forming a contact in a semiconductor memory device, as recited in claim 10, wherein the first and second conductive layers comprise polysilicon, and the third conductive layer comprises tungsten silicide.

15. A method for forming a contact in a semiconductor memory device, as recited in claim 10, wherein the first self-aligned contact pad is a storage node contact pad, and the second and third self-aligned contact pads are bit line contact pads.

16. A method for forming a contact in a semiconductor memory device, comprising;

forming a transistor over a semiconductor substrate having a cell array region and a core region;

forming a first insulating layer over the semiconductor substrate;

etching the first insulating layer until a surface of the semiconductor substrate is exposed, to form a first and second contact holes in the cell array region and a third contact hole in the core region;

filling the contact holes with a first conductive layer;

etching the first conductive layer to form first and second self-aligned contact pads in the cell array region and a third self-aligned contact pad in the core region, the first, second, and third contact pads being recessed in the contact holes a depth from a top surface of the first insulating layer;

forming a second insulating layer over the first insulating layer, the second insulating layer exhibiting a poor step coverage, and exposing upper surfaces of the first, second, and third contact pads, forming second and third conductive layers over the semiconductor substrate and the first, second, and third contact pads; and etching the second and third conductive layers using a bit line forming mask so as to form a bit line, wherein the second conductive layer over the first contact pad is over-etched to electrically insulate the first contact pad from the bit line.

* * * * *